US012574022B1

(12) United States Patent
Lee

(10) Patent No.: US 12,574,022 B1
(45) Date of Patent: Mar. 10, 2026

(54) SERDES TRANSMITTER AND RECEIVER UTILIZING SINGLE FREQUENCY PHASE AMPLITUDE MODULATION

(71) Applicant: Texas Milkyway Inc., Plano, TX (US)

(72) Inventor: Sheau-Jiung Lee, Plano, TX (US)

(73) Assignee: Texas Milkyway Inc., Plano, TX (US)

( * ) Notice: Subject to any disclaimer, the term of this patent is extended or adjusted under 35 U.S.C. 154(b) by 0 days.

(21) Appl. No.: 19/359,117

(22) Filed: Oct. 15, 2025

Related U.S. Application Data

(63) Continuation of application No. 19/080,123, filed on Mar. 14, 2025.

(51) Int. Cl.
*H03K 7/02* (2006.01)
*H04L 7/00* (2006.01)
*H04L 25/02* (2006.01)

(52) U.S. Cl.
CPC ............. *H03K 7/02* (2013.01); *H04L 7/0008* (2013.01); *H04L 25/0272* (2013.01)

(58) Field of Classification Search
CPC ...... H03K 7/02; H04L 7/0008; H04L 25/0272
See application file for complete search history.

(56) References Cited

U.S. PATENT DOCUMENTS

| | | | |
|---|---|---|---|
| 9,369,318 B2 | 6/2016 | Lee et al. | |
| 9,426,016 B2 | 8/2016 | Lee et al. | |
| 9,712,368 B2 | 7/2017 | Lee et al. | |
| 10,614,027 B2 | 4/2020 | Lee | |
| 11,669,474 B1 | 6/2023 | Lee et al. | |
| 2010/0215118 A1* | 8/2010 | Ware ...................... H03M 5/16 | |
| | | | 375/295 |
| 2012/0038393 A1* | 2/2012 | Van Der Goes .... H04L 25/0282 | |
| | | | 327/110 |

* cited by examiner

*Primary Examiner* — Sung S Ahn
(74) *Attorney, Agent, or Firm* — Vedder Price P.C.

(57) ABSTRACT

Multiple examples are disclosed of SerDes transmitters and receivers. In one example, a transmitter comprises a mapping block to receive a clock signal and a two-bit data signal and to generate a plurality of pairs of digital values; a plurality of current steering blocks, each of the plurality of current steering blocks receiving one of the plurality of pairs of digital values to generate a pair of currents; a current summer and modulation block to receive the pair of currents from each of the plurality of current steering blocks to generate a differential output signal; wherein the differential output signal is a single frequency pulse amplitude modulated signal wherein the single frequency is a frequency of the clock signal.

20 Claims, 12 Drawing Sheets

FIGURE 1

SERDES TRANSMITTER AND RECEIVER UTILIZING SINGLE FREQUENCY PHASE AMPLITUDE MODULATION

PRIORITY CLAIM

This application is a continuation of U.S. patent application Ser. No. 19/080,123, filed on Mar. 14, 2025, and titled, "SerDes Transmitter and Receiver Utilizing Single Frequency Phase Amplitude Modulation," which is incorporated by reference herein.

TECHNICAL FIELD

A Serializer Deserializer (SerDes) transmitter and receiver utilizing single frequency phase amplitude modulation is disclosed.

BACKGROUND

SerDes transmitters and receivers for use in high speed communication systems are known in the prior art. A SerDes transmitter converts data from parallel form into serial form and transmits the data in serial form, typically over a single line or a differential pair. A SerDes receiver receives the serial data and converts it back into parallel form.

SerDes is used in PCIe and Ethernet. PCIe and Ethernet have evolved from using Non-Return-to-Zero (NRZ) SerDes (also known as Pulse Amplitude Modulation 2-level or PAM2), which utilizes two amplitude levels, each representing one bit of data, to Pulse Amplitude Modulation 4-level (PAM4), which utilizes four amplitude levels, each representing two bits of data. PAM4 is an improvement over NRZ because PAM4 requires a lower channel Nyquist frequency than NRZ. However, PAM4 still suffers from the inherent disadvantages in transactional SerDes systems such as PCIe and Ethernet, which require the use of flow control units (referred to as FLITs) to maintain circuit robustness based on time-division multiplexing and demultiplexing. Furthermore, such SerDes systems require clock-data recovery circuits (CDR) and elastic buffers to mitigate the asynchronous nature between two chips, as seen in PCIe, Ethernet, and NVLink. FLIT control requires read-write arbitration from the bus masters, resulting in the loss of full-duplex capability and reducing the effective bandwidth by half. The CDR and elastic buffer also contribute to additional long latency in end-to-end transfers, causing the effective bandwidth to be dramatically reduced from its peak.

In many applications, such as connecting two silicon dies or two silicon chipsets, both frequency bandwidth and latency are crucial. U.S. Pat. Nos. 9,369,318, 9,426,016, and 9,712,368, by the same inventor as the present application and titled "Scalable serial/deserial I/O for chip-to-chip connection based on multi-frequency QAM scheme," "Self-track scheme for multi-frequency band serializer/deserializer I/O circuits," and "Differential current mode low latency modulation and demodulation for chip-to-chip connection," respectively, propose RF SerDes architectures that do not require CDR, elastic buffers, and FLIT control, thereby overcome certain limitations of previous SerDes systems used in PCIe and Ethernet. These techniques deliver both ultra-wide bandwidth and reduced latency. However, these architectures require more carriers than other SerDes systems, which increases the bandwidth at the expense of higher power consumption and the usage of more complicated circuits, such as filters, modulators, and phase extrapolators.

What is needed is an improved SerDes architecture that overcomes these challenges and improves power consumption while also providing high bandwidth.

SUMMARY OF THE INVENTION

Various embodiments of SerDes transmitters and receivers and associated methods are disclosed. The embodiments utilize SerDes with a single frequency carrier to modulate a double-data rate PAM signal, improving power consumption compared to prior art systems while maintaining ultra-high frequency bandwidth. The embodiments utilize a transmitter that maps an input signal to a PAM-modulated signal at a double rate while using a symbol clock and an optional valid bit and a receiver that demaps the signal to recover the input signal, symbol clock, and the optional valid bit, eliminating the need for modulation mixers for upconversion and demodulation mixers for down conversion as well as the low-pass and band-pass filters required in the prior art. The transmitter also implements a DC bias differential current DAC to deliver high-performance analog differential signals. The receiver comprises a flash current mode ADC that directly interfaces with a common-gate receiver amplifier.

This embodiments can further reduce the latency of SerDes end-to-end timing and can be applied to replicate a high-speed SoC internal bus cycle by cycle in real-time with minimal latency, low power consumption, and low circuit complexity, enabling another chipset connected to the SoC to function like a monolithic SoC without advanced packaging technology.

BRIEF DESCRIPTION OF THE DRAWINGS

FIG. 1 depicts a system comprising a transmitter and a receiver.

DETAILED DESCRIPTION OF THE INVENTION

Figure 1:
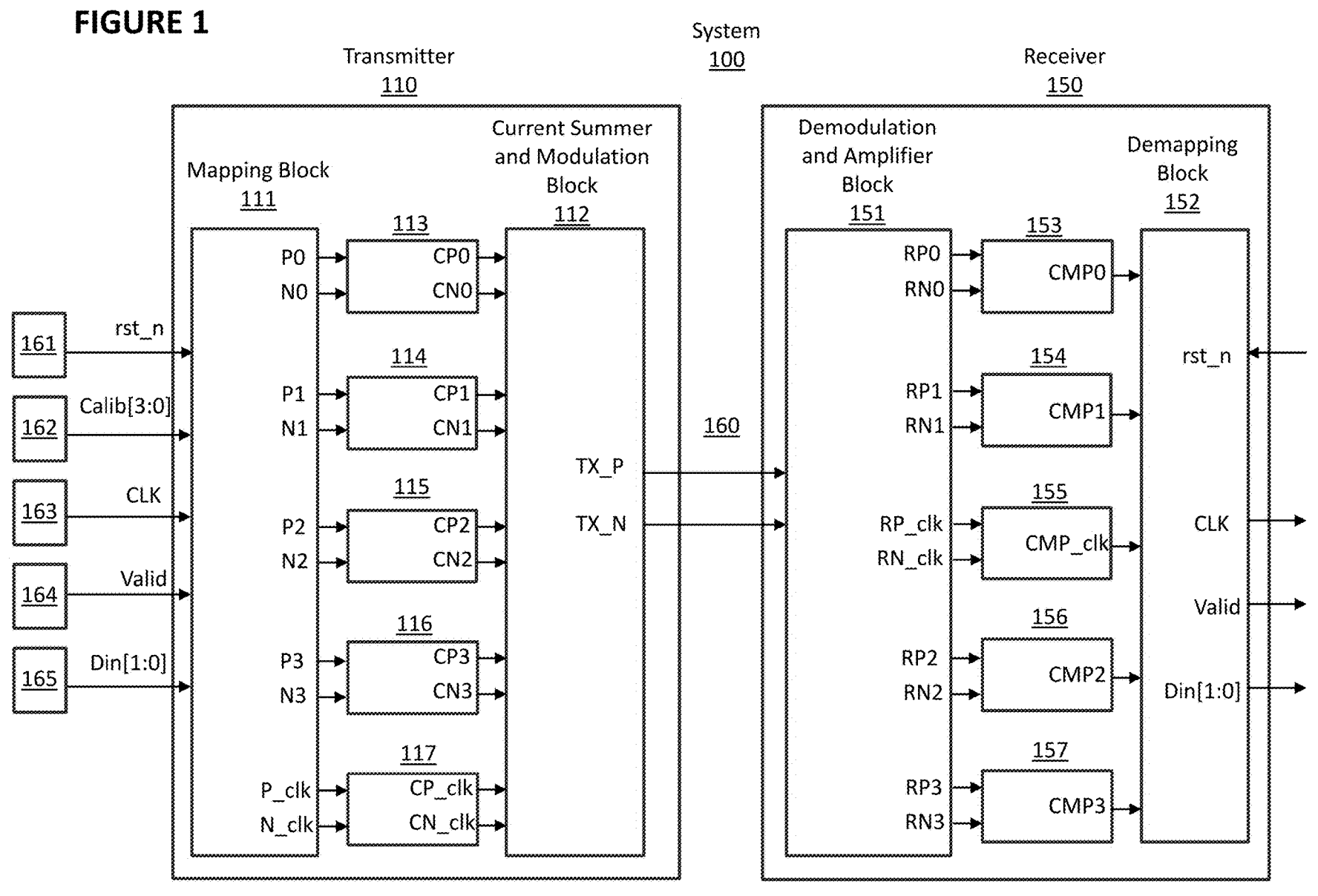
Figure 2:
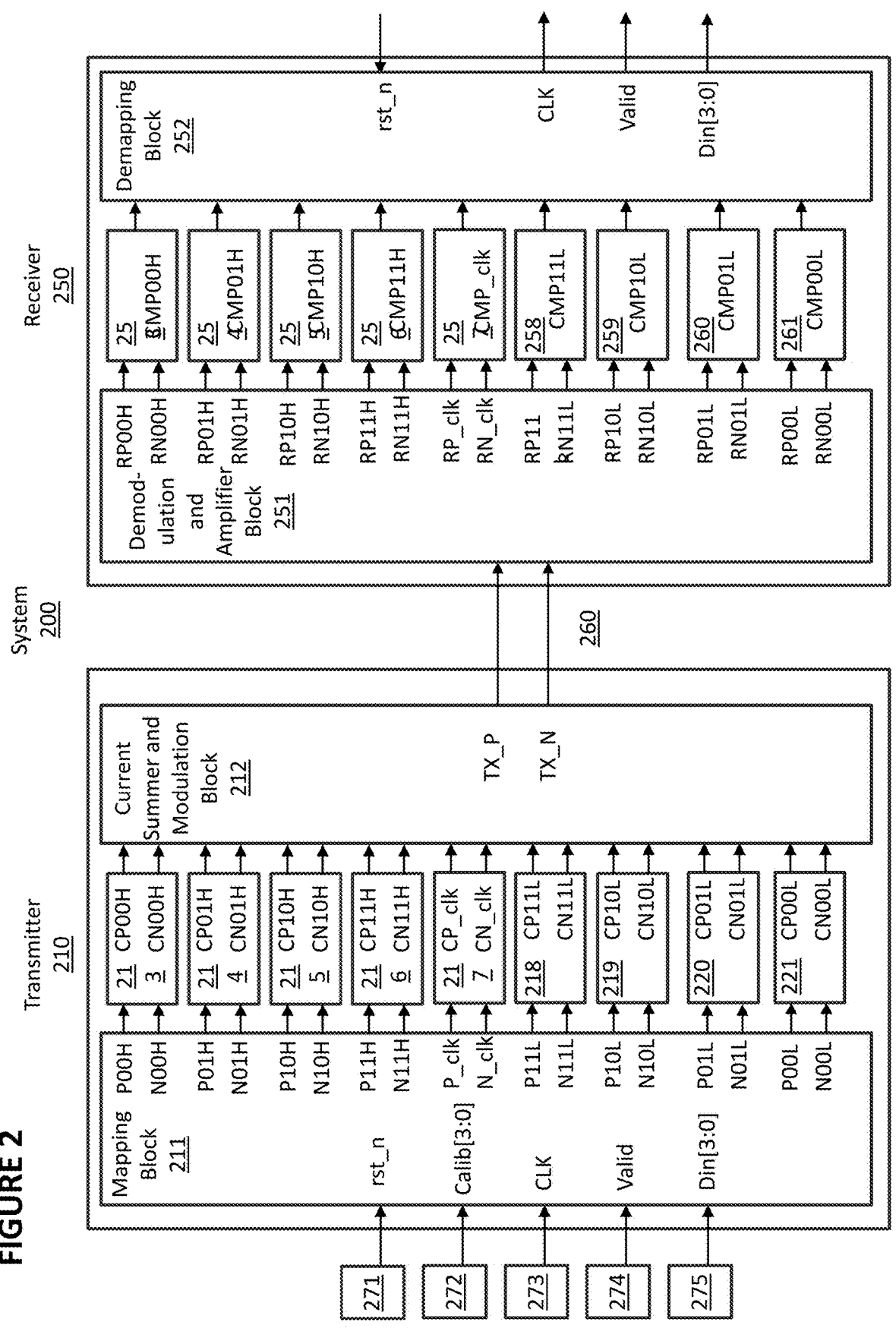
FIG. 2 depicts another system comprising a transmitter and a receiver.

FIG. 1 depicts system 100 comprising transmitter 110 and receiver 150. Transmitter 110 in this example is a PAM-4 SerDes transmitter that uses a single-frequency carrier to modulate and transmit to receiver 150 over interface 160 a symbol clock (CLK), an optional valid bit (Valid), and 2-bit data signal (Din[1:0]) in the form of a differential current signal (TX_P and TX_N). The frequency of the single-frequency carrier is the frequency of the symbol clock. Receiver 150 in this example is a PAM-4 SerDes receiver that receives the transmitted differential current signal and restores from it the symbol clock (CLK), the optional valid bit (Valid) if originally present, and the 2-bit data signal (Din[1:0]). Transmitter 110 and receiver 150 both receive a reset signal (rst_n), which is used to reset transmitter 110 and receiver 150.

Transmitter 110 comprises mapping block 111, current summer and modulation block 112, and current steering blocks 113, 114, 115, 116, and 117.

Mapping block 111 receives rst_n, Calib[3:0], CLK, Valid, and Din[1:0] from devices 161, 162, 163, 164, and 165, respectively, and in response generates five pairs of digital signals—P0 and N0; P1 and N1; P2 and N2; P3 and N3; and P_clk and N_clk—to drive current steering blocks 113, 114, 115, 116, and 117, respectively. Devices 161, 162, 163, 164, 165 each can be a processor, controller, ASIC, state machine, or other device. Two or more of devices 161, 162, 163, 164, and 165 optionally can be the same device.

An example of a mapping utilized by mapping block 111 to generate the five pairs of digital signals is shown in Table 1. Table 1 also shows the values for TX_P, TX_N, and TX_P–TX_N that will be generated by current summer and modulation block 112 in response to the five pairs of digital signals.

other words, one bit of data is transmitted during each half of a clock cycle. When CLK=1, the bit threshold is 200 μA (meaning Din[0]=1 is converted to a current greater than 200 μA such as 300 μA and Din[0]=0 is converted to a current less than 200 μA such as 100 μA), and when CLK=0, the bit threshold is −200 μA (meaning Din[1]=1 is converted to a current less than −200 μA such as −300 μA and Din[1]=0 is converted to a current greater than −200 μA such as −100 μA). Thus, each bit in Din[1:0] is converted to one of two different levels, although different levels are used for Din[1] and Din[0]. This is a slight variation on PAM-4 but still allows for the transmission of two bits during a symbol clock cycle, which results in a double data rate compared to PAM-2. This single-level comparison allows for faster ADC speed in receiver 150.

The ISI (Intersymbol Interference) problem found in the prior art is greatly reduced because the signal is always AC toggling, preventing long '1' or '0' sequences. The mapping produces frequency modulation at a higher differential current when idle.

Current steering blocks 113, 114, 115, 116, and 117 each comprises a differential current digital-to-analog converter

TABLE 1

EXAMPLE OF MAPPING AND TRANSMISSION SCHEME

| Calib[3:0] | CLK | Valid | Din[1:0] | P0, N0 | P1, N1 | P2, N2 | P3, N3 | P_clk, N_clk | TX_P | TX_N | TX_P-TX_N |
|---|---|---|---|---|---|---|---|---|---|---|---|
| 1000 | 1 | x | xx | 0, 0 | 0, 0 | 0, 0 | 0, 0 | 0, 0 | 0 μA | 0 μA | 0 μA |
| 1000 | 0 | x | xx | 0, 0 | 0, 0 | 0, 0 | 0, 0 | 0, 0 | 0 μA | 0 μA | 0 μA |
| 1001 | 1 | x | xx | 0, 1 | 0, 1 | 0, 0 | 0, 0 | 0, 0 | 200 μA | 0 μA | 200 μA |
| 1001 | 0 | x | xx | 1, 0 | 1, 0 | 0, 0 | 0, 0 | 0, 0 | 0 μA | 200 μA | −200 μA |
| 1010 | 1 | x | xx | 0, 1 | 0, 1 | 0, 1 | 0, 1 | 0, 0 | 500 μA | 100 μA | 400 μA |
| 1010 | 0 | x | xx | 1, 0 | 1, 0 | 1, 0 | 1, 0 | 0, 0 | 100 μA | 500 μA | −400 μA |
| 0xxx | 1 | 0 | xx | 0, 1 | 0, 1 | 0, 1 | 0, 1 | 0, 1 | 500 μA | 0 μA | 500 μA |
| 0xxx | 0 | 0 | xx | 1, 0 | 1, 0 | 1, 0 | 1, 0 | 1, 0 | 0 μA | 500 μA | −500 μA |
| 0xxx | 1 | 1 | 00 | 0, 1 | 0, 0 | 0, 0 | 0, 0 | 0, 0 | | | 100 μA |
| 0xxx | 0 | 1 | 00 | 1, 0 | 0, 0 | 0, 0 | 0, 0 | 0, 0 | | | −100 μA |
| 0xxx | 1 | 1 | 01 | 0, 1 | 0, 1 | 0, 1 | 0, 0 | 0, 0 | | | 300 μA |
| 0xxx | 0 | 1 | 01 | 1, 0 | 0, 0 | 0, 0 | 0, 0 | 0, 0 | | | −100 μA |
| 0xxx | 1 | 1 | 10 | 0, 1 | 0, 0 | 0, 0 | 0, 0 | 0, 0 | | | 100 μA |
| 0xxx | 0 | 1 | 10 | 0, 1 | 0, 1 | 0, 1 | 0, 0 | 0, 0 | | | −300 μA |
| 0xxx | 1 | 1 | 11 | 0, 1 | 0, 1 | 0, 1 | 0, 0 | 0, 0 | | | 300 μA |
| 0xxx | 0 | 1 | 11 | 0, 1 | 0, 1 | 0, 1 | 0, 0 | 0, 0 | | | −300 μA |

A calibration mode is entered by setting Calib[3]=1. During the calibration mode, the currents generated TX_P and TX-N can be used to calibrate certain components in receiver 150, explained in greater detail below. In the calibration mode, the differential transmission current (TX_P–TX-N) will have the following values:

0 μA when CLK=1 and Calib[3:0]=1000;
0 μA when CLK=0 and Calib[3:0]=1000;
200 μA when CLK=1 and Calib[3:0]=1001;
−200 μA when CLK=0 and Calib[3:0]=1001;
400 μA when CLK=1 and Calib[3:0]=1010; and
−400 μA when CLK=0 and Calib[3:0]=1010.

These calibration currents can be used to calibrate comparator and calibration blocks 153, 154, 155, 156, and 157 in receiver 150, which will then use those same current values in the comparisons they will perform during the receiving process, explained in greater detail below.

With reference still to Table 1, if Valid=0, there is no data to be transmitted and (TX_P–TX-N) will to 500 μA when CLK=1 and −500 μA when CLK=0. Thus, the transmitted signal will be amplitude modulated even when idle.

If Valid=1, then the transmitter can be used to transmit data received on Din[1:0]. The two bits are transmitted by transmitting bit 0 when CLK=1 and bit 1 when CLK=0; in (DAC) that converts two digital bits into differential analog currents. A more detailed example is provided below with reference to FIG. 3. Current steering block 113 receives digital signal pair P0 and N0 and generates differential analog currents CP0 and CN0; current steering block 114 receives digital signal pair P1 and N1 and generates differential analog currents CP1 and CN1; current steering block 115 receives digital signal pair P2 and N2 and generates differential analog currents CP2 and CN2; current steering block 116 receives digital signal pair P3 and N3 and generates differential analog currents CP3 and CN3; and current steering block 117 receives digital signal pair P_clk and N_clk and generates differential analog currents CP_clk and CN_clk.

In a calibration mode, mapping block 111 receives calibration data on Calib[3:0] and in response current steering blocks 113, 114, 115, 116, and 117 will create calibration current for comparator and calibration blocks 153, 154, 155, 156, and 157 in receiver 150, which will be explained in greater detail below.

Current summer and modulation block 112 sums the differential analog currents output by current steering blocks 113, 114, 115, 116, and 117 and transmits the resulting differential current (TX_P and TX_N) over channel 160. A more detailed example is provided below with reference to FIGS. 4A and 4B.

Through DC coupling, the differential current is directly coupled to demodulation and amplifier block 151 in receiver 150.

With respect to receiver 150, demodulation and amplifier block 151 generates five mirror currents for comparator and calibration blocks 153, 154, 155, 156, and 157. A more detailed example is provided below with reference to FIGS. 4C, 4D, and 4E. The threshold of each of comparator and calibration blocks 153, 154, 155, 156, and 157 is individually adjusted during the calibration mode. This calibration can adjust for DC offset and achieve high-speed, high-resolution operation. A more detailed example is provided below with reference to FIG. 5.

The outputs from comparator and calibration blocks 153, 154, 155, 156, and 157 are provided to demapping block 152 to restore the input originally provided to transmitter 110: CLK, Valid, and Din[1:0]. Table 2 provides an example of a demapping scheme implemented by demapping block 152 to map the five outputs from comparator and calibration blocks 153, 154, 155, 156, and 157 to generate CLK, Valid, and Din[1:0]. The thresholds for the comparator function in comparator and calibration blocks 153, 154, 155, 156, and 157 in this example are as follows:

CMP_clk: 0 μA
CMP0: 400 μA.
CMP1: 200 μA
CMP2: −200 μA
CMP3: −400 μA

TABLE 2

| | | | EXAMPLE OF DEMAPPING SCHEME | | | | | |
|---|---|---|---|---|---|---|---|---|
| CMP_clk | CMP0 | CMP1 | CMP2 | CMP3 | CLK | Valid | Din[0] | Din[1] |
| 1 | x | x | x | x | 1 | x | x | x |
| 0 | x | x | x | x | 0 | x | x | x |
| 1 | 1 | x | x | x | 1 | 0 | x | x |
| 0 | 1 | x | x | 1 | 0 | 0 | x | x |
| 1 | 0 | 1 | x | x | 1 | 1 | 1 | x |
| 1 | 0 | 0 | x | x | 1 | 1 | 0 | x |
| 0 | x | x | 0 | 0 | 0 | 1 | x | 0 |
| 0 | x | x | 1 | 0 | 0 | 1 | x | 1 |

The demapping in Table 2 shows that CMP_clk essentially provides the symbol clock (CLK) received by transmitter 110. This way, the clock is self-tracked along the entire signal propagation path. Transmitter 110 and receiver 150 are fully synchronous, including any jitter present in the transmitted signal, without utilizing a CDR or elastic buffer in receiver 150.

The valid bit (Valid) is used to control the transmitted data without using headers or packets or FLIT control, achieving 100% bandwidth utilization. When Valid=1, the data at the output is valid; otherwise, the data is discarded. Since the transmission uses double data rate, the Valid bit is output at CMP0 when CLK=1 and at CMP3 when CLK=0.

Because of the double data rate, two bits of data are sampled through single-level comparators without being encoded. When CLK=1, Din[0] is the output of CMP1, and when CLK=0, Din[1] is the output of CMP2. This demapping of all comparators can robustly restore CLK, Valid, and Din[1:0] while tracking process, voltage, and temperature variations.

The design of system 100 eliminates the need for CDR, elastic buffers, and FLIT control required in certain prior art systems. The direct coupling of transmitter 110 and receiver 150 through single-carrier frequency modulation at the symbol rate will not cause baseline wandering as might be present in AC coupling in transactional SerDes. Therefore, system 100 achieve the benefits of RF SerDes with much simpler circuits than prior art designs. The PAM scheme using single-frequency modulation can achieve the performance and advantages of multiple carrier frequencies with a simplified circuit architecture. This eliminates the need for mixers and low-pass filters. This further reduces latency caused by analog circuits and simplifies analog circuit design compared to the prior art.

The same principles of system 100 in FIG. 1 can be applied to a system that utilizes PAM-8 RF SerDes, which utilizes 8 different amplitude levels, each representing three bits, or PAM-16 RF SerDes, which utilizes 16 different amplitude levels, each representing four bits.

FIG. 2 depicts system 200 comprising transmitter 210 and receiver 250. Transmitter 210 in this example is a PAM-16 SerDes transmitter that uses a single-frequency carrier to modulate and transmit to receiver 250 over channel 260 a symbol clock (CLK), an optional valid bit (Valid), and 4-bit data signal (Din[3:0]) in the form of a differential current signal (TX_P and TX_N). The frequency of the single-frequency carrier is the frequency of the symbol clock. Receiver 250 in this example is a PAM-16 SerDes receiver that receives the transmitted differential current signal and restores from it the symbol clock (CLK), the optional valid bit (Valid) if originally present, and the 4-bit data signal (Din[3:0]). Transmitter 210 and receiver 250 both receive a reset signal (rst_n), which is used to reset transmitter 210 and receiver 250.

Transmitter 210 comprises mapping block 211 (based on the same principles as mapping block 111 in FIG. 1), current summer and modulation block 212 (based on the same principles as summer and modulation block 112 in FIG. 1), and current steering blocks 213, 214, 215, 216, 217, 218, 219, 220, and 221 (based on the same principles as current steering blocks 113, 114, 115, 116, and 117 in FIG. 1). Receiver 250 comprises demodulation and amplifier block 251 (based on the same principles as demodulation and amplifier block 151 in FIG. 1), demapping block 252 (based on the same principles as demapping block 152 in FIG. 1), and comparator and calibration blocks 253, 254, 255, 256, 257, 258, 259, 260, and 261 (based on the same principles as comparator and calibration blocks 153, 154, 155, 156, and 157 in FIG. 1). The symbol clock is still recovered from CMP_clk as in FIG. 1, and the Valid bit is recovered from CMP00H when CLK=1 and from CMP00L when CLK=0.

Mapping block 111 receives rst_n, Calib[3:0], CLK, Valid, and Din[3:0] from devices 271, 272, 273, 274, and 275, respectively, and in response generates nine pairs of digital signals—P00H and N00H; P01H and N01H; P10H and N10H; P11H and N11H; P_clk and N_clk; P11L and
N11L; P10L and N10L; P01L and N01L; and P00L and
N00L—to drive current steering blocks 213, 214, 215, 216,
217, 218, 219, 220, and 221, respectively. Devices 271, 272,
273, 274, and 275 each can be a processor, controller, ASIC,
state machine, or other device. Two or more of devices 271,
272, 273, 274, and 275 optionally can be the same device.

Instead of using a single level as in FIG. 1, system 200
uses three levels (CMP01H, CMP10H, and CMP11H) to
encode data [1:0] when CLK=1 and three levels (CMP11L,
CMP10L, and CMP01L) to encode data [3:2] when CLK=0.

The calibration of comparator and calibration blocks 253,
254, 255, 256, 257, 258, 259, 260, and 261 is performed in
a similar manner as in system 100 of FIG. 1.

Figure 3:
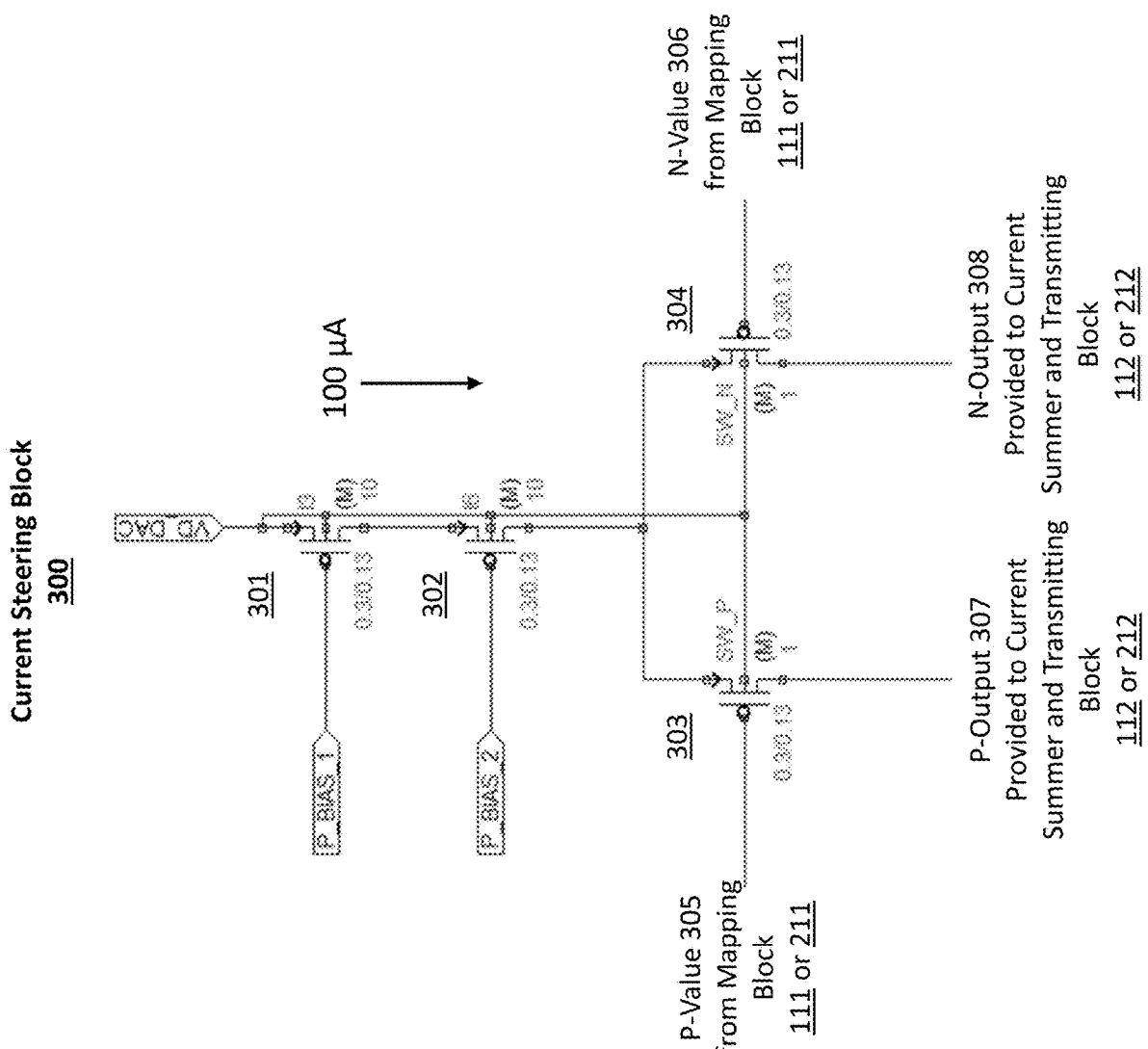
FIG. 3 depicts an example of a current steering block.

FIG. 3 depicts current steering block 300, which is an
example implementation of current steering blocks 113, 114,
115, 116, and 117 in FIG. 1 and current steering blocks 213,
214, 215, 216, 217, 218, 219, 220, and 221 in FIG. 2.

Current steering block 300 comprises PMOS transistors
301, 302, 303, and 304, arranged as shown. Current steering
block 300 is coupled to a voltage source, VD_DAC. PMOS
transistor 301 is controlled by control signal P_BIAS_1 and
PMOS transistor 302 is controlled by control signal
P_BIAS_2 so that PMOS transistors 301 and 302 source a
current of 100 μA.

PMOS transistor 303 is controlled by P-value 305
received from mapping block 111 in FIG. 1 or mapping
block 211 in FIG. 2 (such as P0, P1, P2, P3, and P_clk for
current steering blocks 113, 114, 115, 116, and 117, respec-
tively in FIG. 1 and P00H, P01H, P10H, P11H, P-clk, P11L,
P10L, P01L, and P00L for current steering blocks 213, 214,
215, 216, 217, 218, 219, 220, and 221, respectively, in FIG.
2).

PMOS transistor 303 outputs P-output 307 to current
summer and transmitting block 112 in FIG. 1 or current
summer and transmitting block 212 in FIG. 2 (such as CP0,
CP1, CP2, CP3, and CP_clk for current steering blocks 113,
114, 115, 116, and 117, respectively, in FIG. 1 and CP00H,
CP01H, CP10H, CP11H, CP-clk, CP11L, CP10L, CP01L,
and CP00L for current steering blocks 213, 214, 215, 216,
217, 218, 219, 220, and 221, respectively, in FIG. 2).

PMOS transistor 304 is controlled by N-value 306
received from mapping block 111 in FIG. 1 or mapping
block 211 in FIG. 2 (such as N0, N1, N2, N3, and N_clk for
current steering blocks 113, 114, 115, 116, and 117, respec-
tively in FIG. 1 and N00H, N01H, N10H, N11H, N-clk,
N11L, N10L, N01L, and N00L for current steering blocks
213, 214, 215, 216, 217, 218, 219, 220, and 221, respec-
tively, in FIG. 2).

PMOS transistor 304 outputs N-output 308 to current
summer and transmitting block 112 in FIG. 1 or current
summer and transmitting block 212 in FIG. 2 (such as CN0,
CN1, CN2, CN3, and CN_clk for current steering blocks
113, 114, 115, 116, and 117, respectively, in FIG. 1 and
CN00H, CN01H, CN10H, CN11H, CN-clk, CN11L,
CN10L, CN01L, and CN00L for current steering blocks
213, 214, 215, 216, 217, 218, 219, 220, and 221, respec-
tively, in FIG. 2).

The values output for P-Output 307 and N-Output 308 in
response to P-Value 305 and N-Value 306 are shown in
Table 3:

TABLE 3

| OPERATION OF CURRENT STEERING BLOCK 300 | | | |
|---|---|---|---|
| P-Value 305 | N-Value 306 | P-Output 307 | N-Output 308 |
| 0 | 1 | 100 μA | 0 μA |
| 1 | 0 | 0 μA | 100 μA |
| 0 | 0 | 50 μA | 50 μA |
| 1 | 1 | 0 μA | 0 μA |

Current steering block 300 can switch current quickly in
advanced node technologies. Performance is enhanced if
PMOS transistors 303 and 304 are well matched because the
ADC calibration requires P-Output 307 and N-Output 308 to
be as close to equal as possible.

Figure 4A:
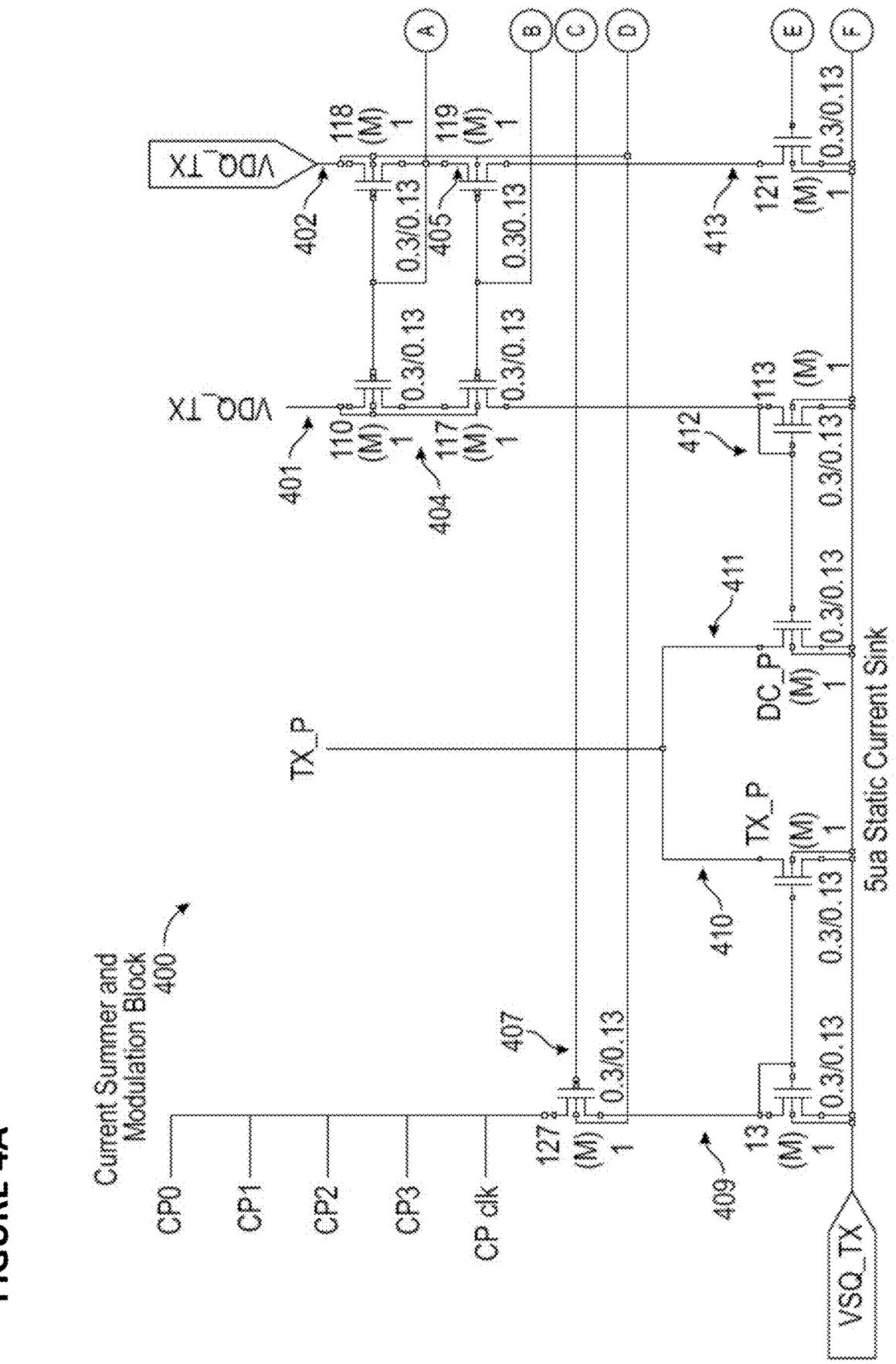
FIGS. 4A and 4B depict an example of a current summer and transmitting block.
Figure 4B:
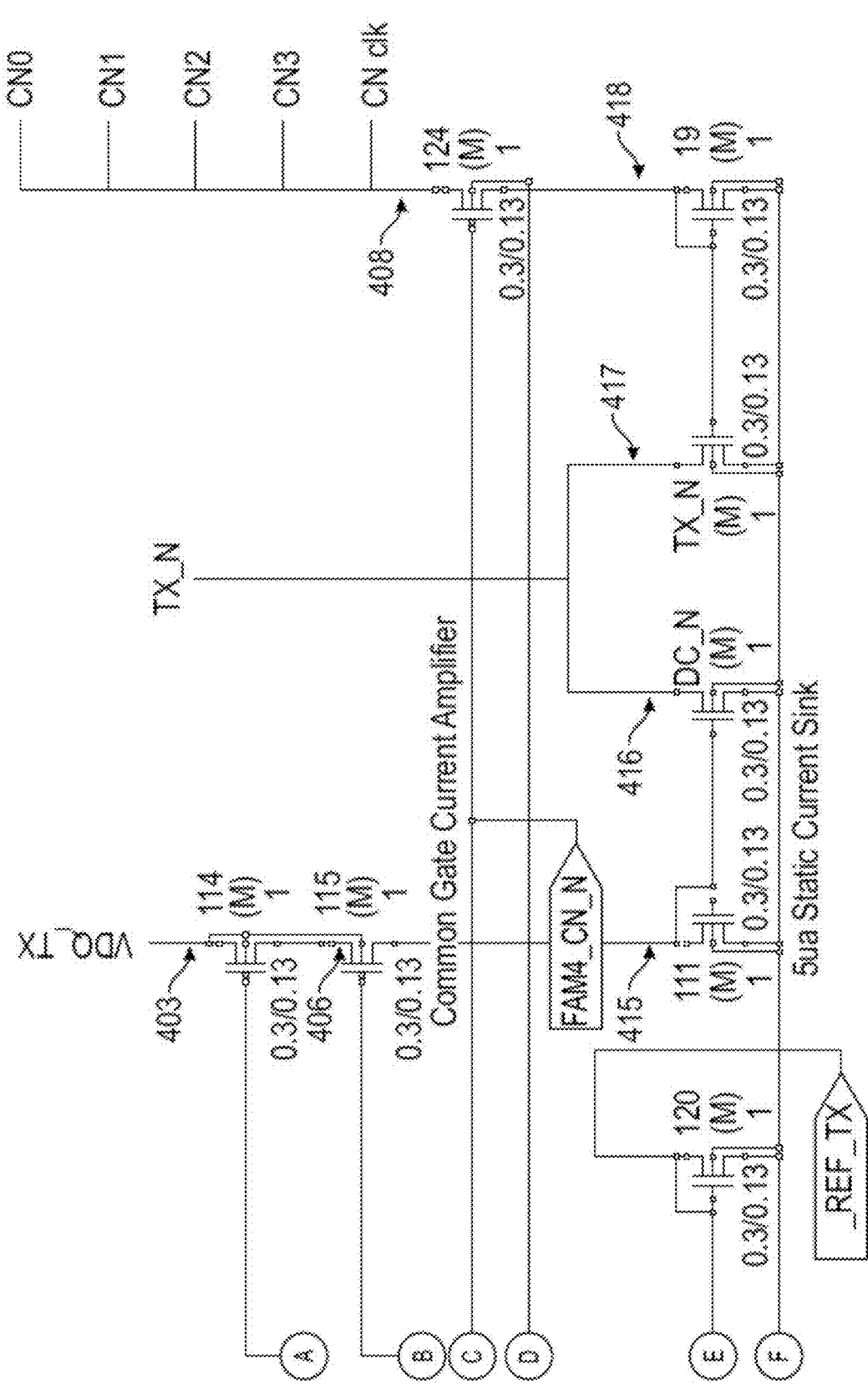

FIGS. 4A and 4B depict current summer and modulation
block 400, which is an example implementation of current
summer and modulation block 112 in FIG. 1. An implemen-
tation of current summer and modulation block 212 in FIG.
2 can be built according to similar principles.

Current summer and modulation block 400 comprises
PMOS transistors 401, 402, 403, 404, 405, 406, 407 and
408; and NMOS transistors 409, 410, 411, 412, 413, 414,
415, 416, 417, and 418, arranged as shown.

PMOS transistors 401, 402 and 403 form a current mirror;
and PMOS transistors 404, 405, and 406 form a current
mirror. NMOS transistors 409 and 410 form a current
mirror; NMOS transistors 411 and 412 form a current
mirror; NMOS transistors 413 and 414 form a current
mirror; NMOS transistors 415 and 416 form a current
mirror; and NMOS transistors 417 and 418 form a current
mirror.

The gates of PMOS transistors 407 and 408 are coupled
together. The common-gate configuration isolates the
capacitance of the NMOS transistors 409, 410, 411, 412,
415, 416, 417, and 418 from TX_P and TX_N during the
high-frequency PAM modulation.

One terminal of PMOS transistor 407 receives CP0, CP1,
CP2, CP3, and CP_clk from current steering blocks 113,
114, 115, 116, and 117 in FIG. 1, which sums CP0, CP1,
CP2, CP3, and CP_clk together at that terminal. One termi-
nal of PMOS transistor 408 receives CN0, CN1, CN2, CN3,
and CN_clk from current steering blocks 113, 114, 115, 116,
and 117 in FIG. 1, which sums CN0, CN1, CN2, CN3, and
CN_clk at that terminal.

During operation, due to the current mirror configuration,
PMOS transistors 401 and 404 generates a current, PMOS
transistors 402 and 405, and PMOS transistors 403 and 406
generate a current, Iref. Iref is further drawn by NMOS
transistor 412 and mirrored into NMOS transistor 411.
Similarly, Iref is drawn by NMOS transistor 415 and mir-
rored into NMOS transistor 416. The current drawn by
NMOS transistor 409 is proportional to the sum of CP0,
CP1, CP2, CP3, and CP_clk, and this is mirrored into
NMOS transistor 410. The current drawn by NMOS tran-
sistor 418 is proportional to the sum of CN0, CN1, CN2,
CN3, and CN_clk, and this is mirrored into NMOS transistor
417. The current drawn by TX_P is the sum of the currents
drawn by NMOS transistors 410 and 411, and the current
drawn by TX_N is the sum of the currents drawn by NMOS
transistors 416 and 417.

In this manner, current summer and modulation block 400
performs a summing function on CP0, CP1, CP2, CP3, and
CP_clk and on CN0, CN1, CN2, CN3, and CN_clk and
performs digital-to-analog conversions on the two sums.
The values TX_P and TX_N are single frequency modulated at the same frequency as CP_clk and CN_clk, as their values will change when CP_clk and CN_clk change.

Figure 4C:
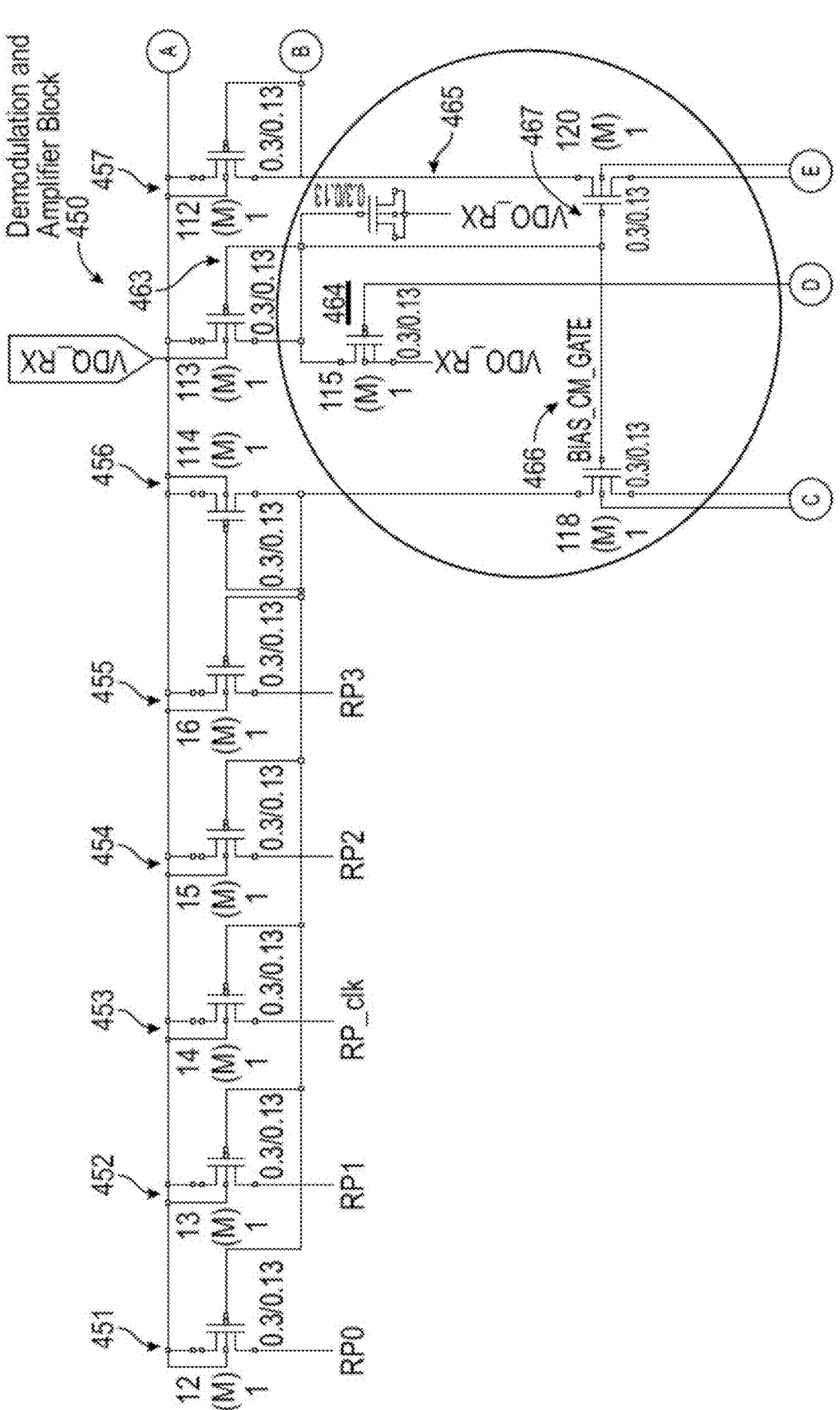
FIGS. 4C, 4D, and 4E depict an example of a common gate current amplifier.
Figure 4D:
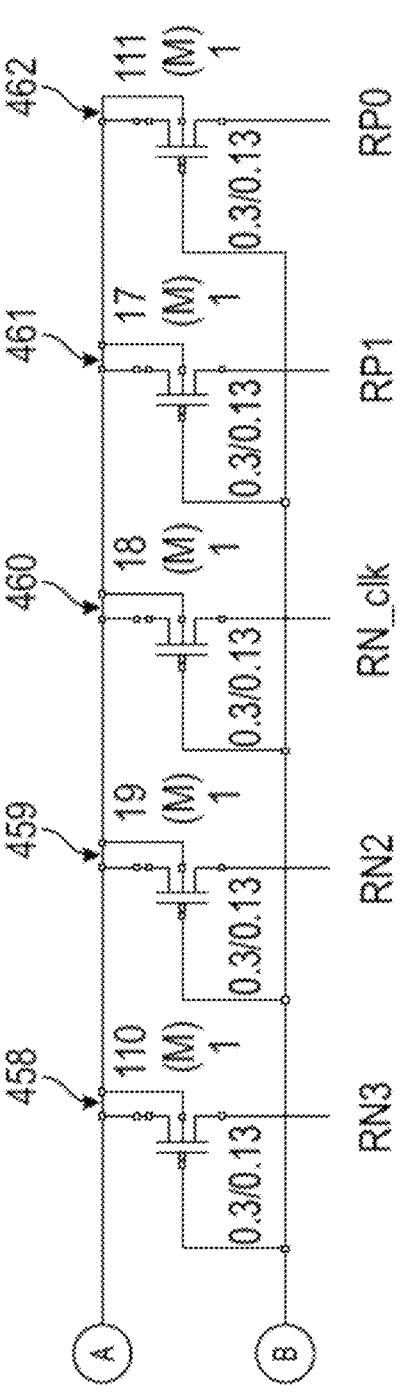
Figure 4E:
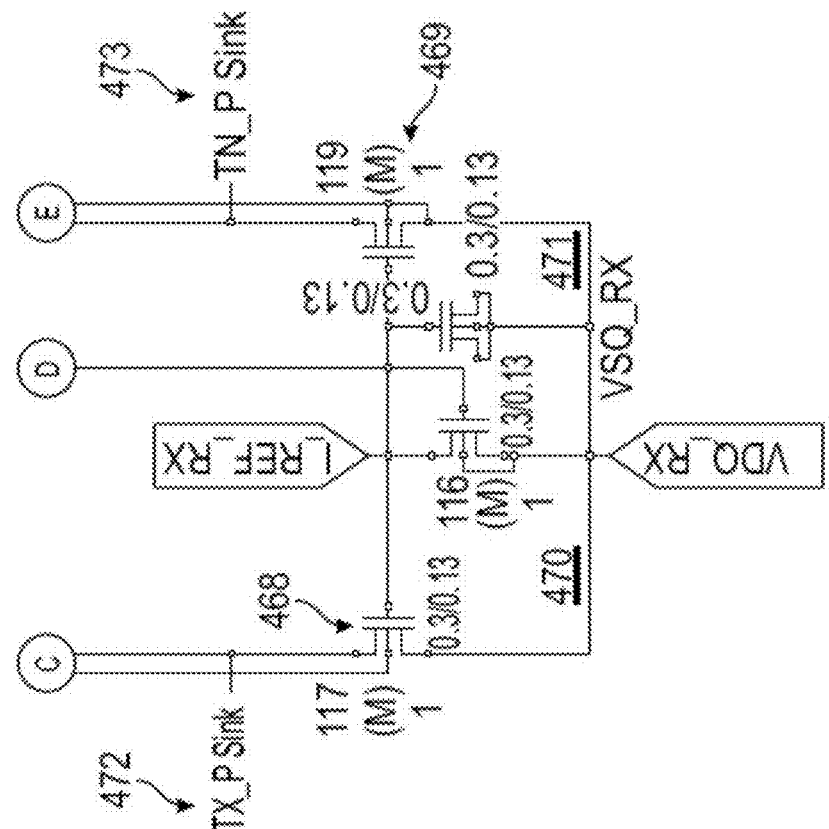

FIGS. 4C, 4D, and 4E depict demodulation and amplifier block 450, which is an example implementation of demodulation and amplifier block 151 in FIG. 1. An implementation of demodulation and amplifier block 251 in FIG. 2 can be built according to similar principles Demodulation and amplifier block 450 comprises PMOS transistors 451, 452, 453, 454, 455, 456, 457, 458, 459, 460, 461, 462, and 463; and NMOS transistors 464, 465, 466, 467, 468, 469, 470, and 471, arranged as shown.

PMOS transistors 451, 452, 453, 454, 455, and 456 are arranged in a current mirror configuration and generate currents RP0, RP1, RP_clk, RP2, and RP3, respectively, in FIG. 1. PMOS transistors 457, 458, 459, 460, 461, and 462 are arranged in a current mirror configuration and generate currents RN3, RN2, RN_clk, RN1, and RN0, respectively, in FIG. 1. Demodulation and amplifier block 450 is coupled to current summer and modulation block of FIGS. 4A and 4B over interfaces 472 and 473. Interface 472 receives the TX_P current, and interface 473 receives the TX_N current. Interfaces 473 and 473 can be, for example, wires or PCB traces.

The gates of NMOS transistors 466 and 467 are coupled together in a common gate configuration to isolate the parasitic capacitances of interfaces 472 and 473 from the differential currents RP0 and RN0, RP1 and RN1, RP_clk and RN_clk, RP2 and RN2, and RP3 and N3.

With reference now to FIGS. 4A, 4B, 4C, 4D, and 4E, to achieve high-frequency, high-gain operation for current summer and modulation block 400 and demodulation and amplifier block 450, a constant DC current is maintained in the signal path, ensuring that the transistors are always biased in their high-performance operating region. This is achieved by NMOS transistors 411 and 416 in FIGS. 4A and 4B and NMOS transistors 468 and 469 in FIG. 4E. This also reduces the signal swing that can interfere with adjacent signal lines and minimizes transmission line reflections due to the high impedance presented to the source.

Figure 5:
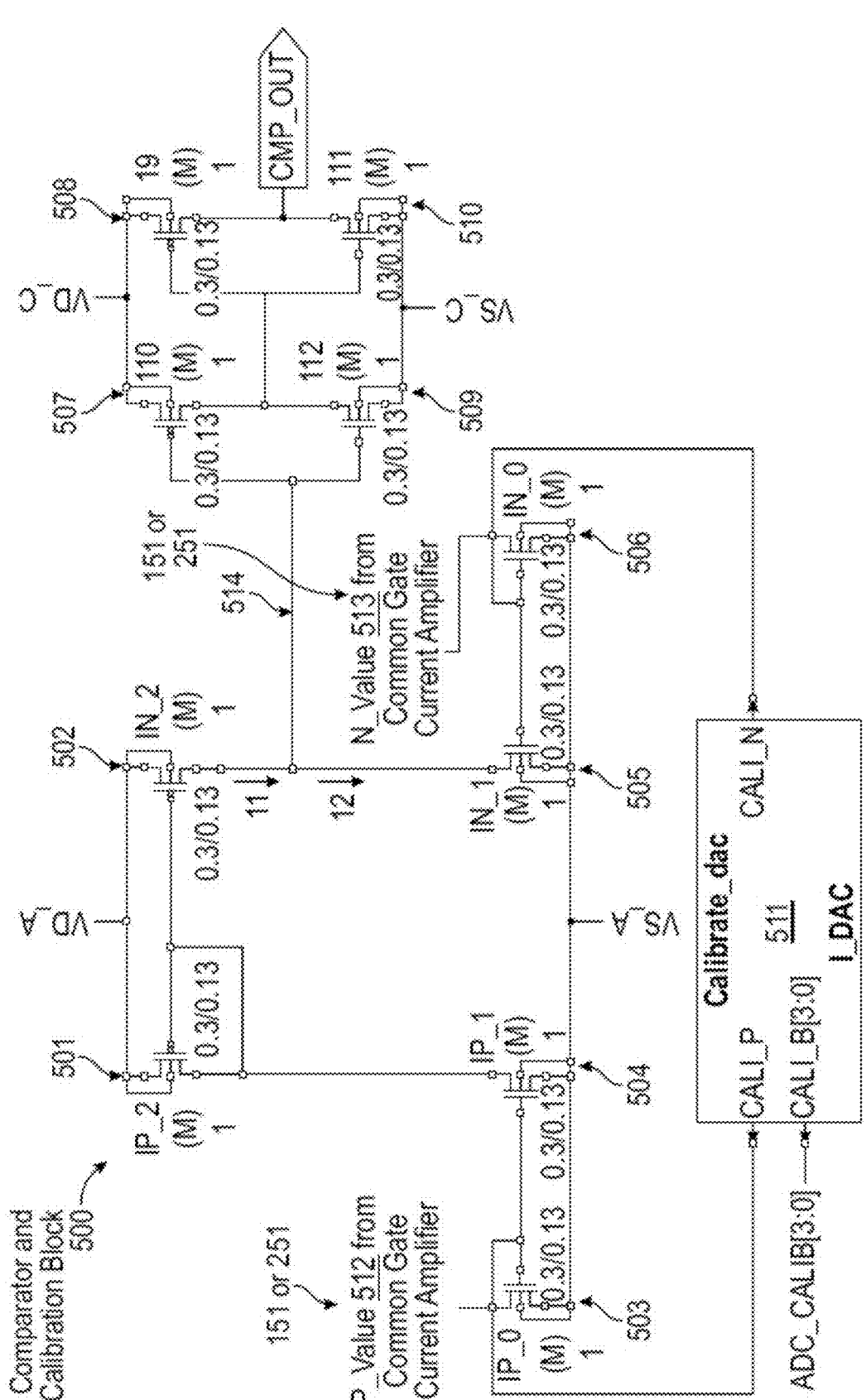
FIG. 5 depicts a current comparator and calibration DAC.

FIG. 5 depicts comparator and calibration block 500, which is an example implementation of comparator and calibration blocks 153, 154, 155, 156, and 157 in FIG. 1 and comparator and calibration blocks 253, 254, 255, 256, 257, 258, 259, 260, and 261 in FIG. 2.

PMOS transistors 501 and 502 form a current mirror; NMOS transistors 503 and 504 form a current mirror; and NMOS transistors 505 and 506 form a current mirror.

Comparator and calibration block 500 comprises PMOS transistors 501, 502, 507, and 508; NMOS transistors 503, 504, 505, 506, 509, and 510; and calibration digital-to-analog converter 511.

A terminal of NMOS transistor 503 receives P-value 512 from demodulation and amplifier block 151 in FIG. 1, such as RP0, RP1, RP_clk, RP2, and RP3 in FIG. 1 or from demodulation and amplifier block 251 in FIG. 2, such as RP00H, RP01H, RP10H, RP11H, RP11L, RP10L, RP01L, and RP00L.

A terminal of NMOS transistor 506 receives N-value 513 from demodulation and amplifier block 151 in FIG. 1, such as RN0, RN1, RN_clk, RN2, and RN3 in FIG. 1 or from demodulation and amplifier block 251 in FIG. 2, such as RN00H, RN01H, RN10H, RN11H, RN11L, RN10L, RN01L, and RN00L.

During a calibration mode, which is initiated when Calib [3]=1 in FIG. 1 or Calib[3]=1 in FIG. 2, calibration digital-to-analog converter 511 will receive the calibration currents provided by TX_P and TX_N as discussed previously.

Calibration digital-to-analog converter 511 comprises a 4-bit DAC to support 16 levels of threshold adjustment for precise comparator operation. The 4-bit DAC is programmed by ADC_Calib[3:0] received from another device (not shown) and the bits are varied until CALI_P matches TX_P and CALI_N matches TX_N. The final 4-bit values are stored for CALI_P and CALI_N and used thereafter during the non-calibration mode.

During the non-calibration mode, NMOS transistor 503 draws a current equal to the sum of P-value 512 and reference current CALI_P, and this current is mirrored in NMOS transistor 504, which causes the same current to be drawn by PMOS transistor 501, which is then mirrored in PMOS transistor 502. NMOS transistor 506 draws a current equal to the sum of N-Value 513 and reference current CALI_N, and this current is mirrored in NMOS transistor 505. PMOS transistor 502 (which is drawing a current I1, which is equal to the sum of P-Value 512 and CALI_P) and NMOS transistor 505 (which is drawing a current I2, equal to the sum of N-Value 513 and CALI_N) essentially will be in a race condition. If I1>I2, then node 514 will be pulled up to a relatively high voltage. If I1<I2, then node 514 will be pulled down close to ground. PMOS transistor 507 and NMOS transistor 509 form a first inverter that inverts the voltage of node 514, and PMOS transistor 508 and NMOS transistor 510 form a second inverter that inverts the output of the first inverter to generate the same voltage as node 514. The first and second inverters operate together as a buffer to generate the output, CMP_OUT. CMP_OUT corresponds to CMP0, CMP1, CMP_clk, CMP2, and CMP3 in FIG. 1 and CMP00H, CMP001H, CMP10H, CMP11H, CMP_clk, CMP11L, CMP10L, CMP01L, and CMP00L in FIG. 2.

Figure 6:
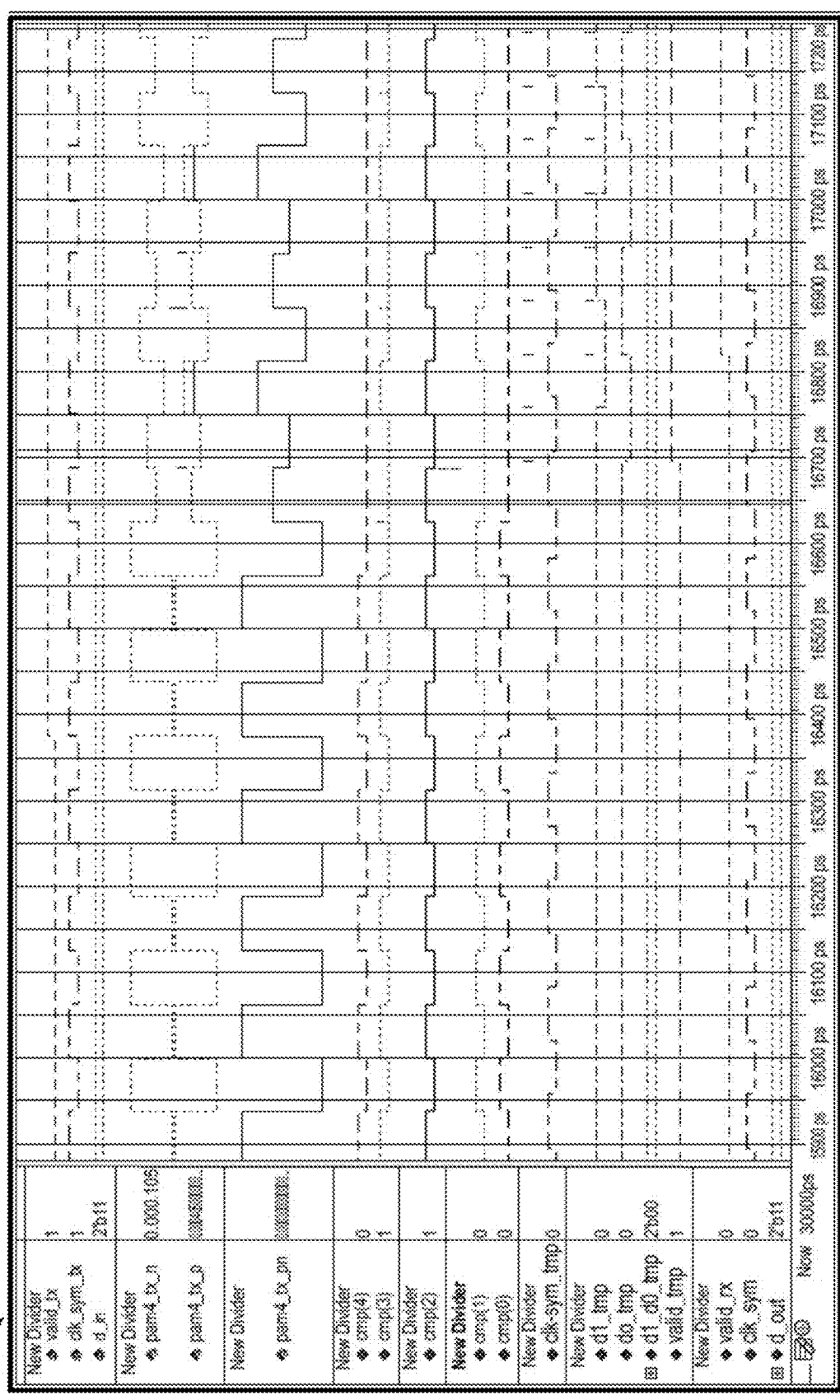
FIG. 6 depicts a timing diagram for the system of FIG. 1.

FIG. 6 depicts timing diagram 600. Timing diagram 600 shows an example of a signal propagation path from transmitter 110 to receiver 150 in FIG. 1. Data transmission starts when valid_tx (which is the Valid signal in FIG. 1) is asserted. As shown, the transmitted data is a series of two-bit values (00, 11, 00, 11, 10, etc.) d_in (which is Din[1:0] in FIG. 1) at the symbol clock rate ck_sym_tx (which is CLK in FIG. 1) when Valid_tx is asserted.

Timing diagram 600 also shows that the differential current pam4_tx_on (which is TX_P−TX_N in FIG. 1) switches between 500 μA and −500 μA when Valid_tx is 0. Timing diagram 600 shows that cmp(4) outputs '1' when ck_sym_tx is high, and cmp(0) outputs '1' when ck_sym_tx is low. The RX demapping indicates that the valid bit should be '0', representing the idle state. The bus connected to the SerDes can ignore the data when Valid_rx is '0'.

Timing diagram 600 shows that when valid_tx is pulled high for a data transmission, the differential current pam4_tx_on becomes smaller than 500 μA and −500 μA. The output of cmp(2) always follows ck_sym_tx. Since the PAM signal is modulated by a single frequency (i.e., the frequency of ck_sym_tx), cmp(2) will follow xk_sym_tx cycle by cycle.

The other comparators (cmp(1) and cmp(3)) capture the two-bit data. As shown in timing diagram 600, they capture "10" when the clock goes high and then "00" when the clock goes low. The valid bit and data "00" are then clocked out at the next rising edge of the symbol clock in the TX. In this way, the SerDes transitions from the idle state to the transmission state.

Figure 7:
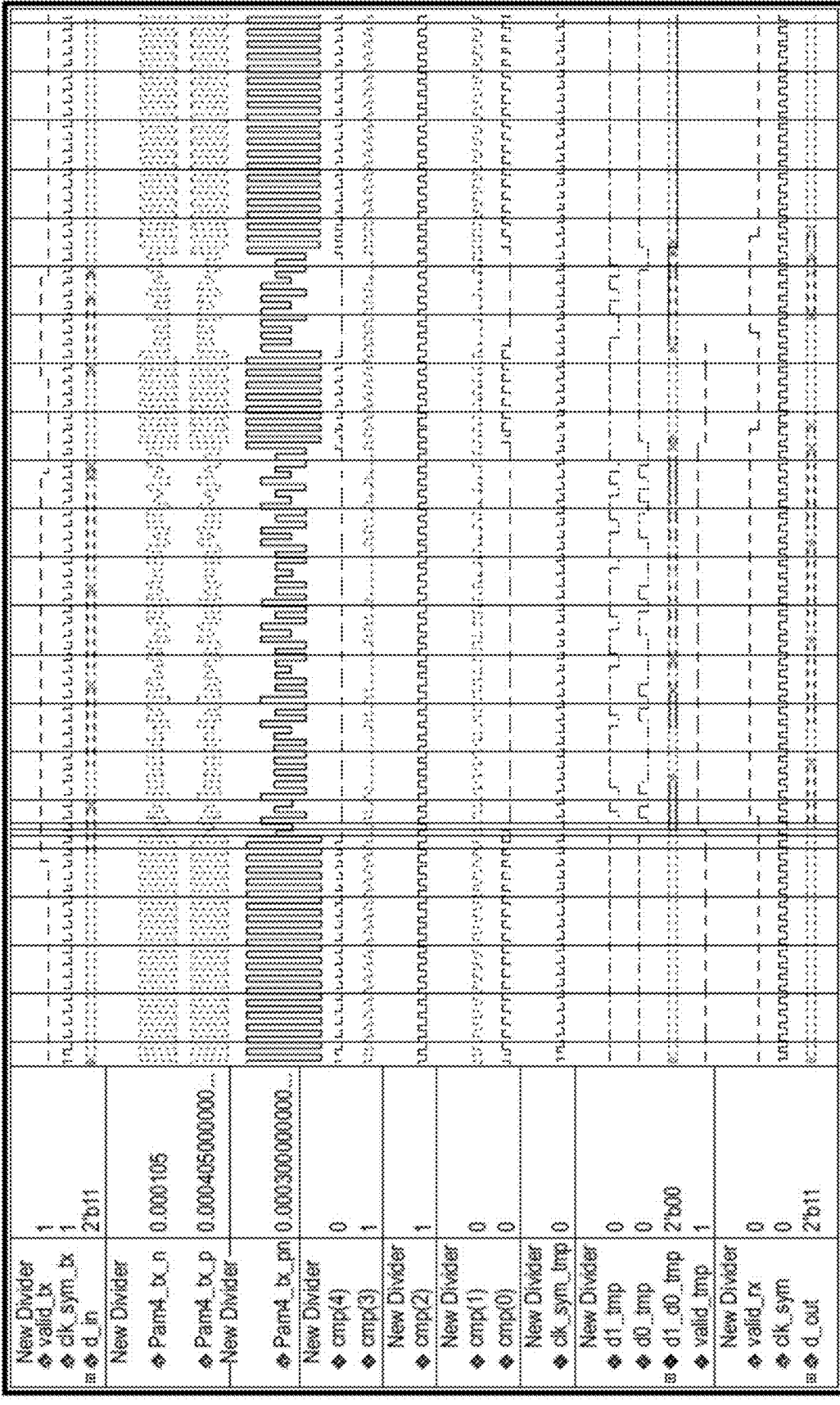
FIG. 7 depicts another timing diagram for the system of FIG. 1.

FIG. 7 depicts timing diagram 700. Timing diagram 700 shows an example of a signal propagation path from transmitter 110 to receiver 150 in FIG. 1. FIG. 7 further illustrates how a single-frequency modulated PAM-4 SerDes can transmit data without the FLIT format, which can reduce effective bandwidth due to payload packing and unpacking overhead. By controlling the valid bit at the TX, any length of data stream can be transmitted. FIG. 7 shows a long transfer followed by an idle period of several cycles, and then a shorter transfer.

As shown in FIG. 7, the symbol clock at the TX is used for both modulation and symbol transmission. The RX SerDes recovers the symbol clock from the analog differential signal without using a PLL, CDR, or elastic buffer. This preserves the characteristics of the symbol clock at the source and tracks it with the data transmission. This achieves the same self-tracking scheme as in multiple-carrier modulated RF SerDes but with the advantage of simplified circuits, eliminating the need for mixers and low-pass filters to isolate adjacent channel interference.

Figure 8:
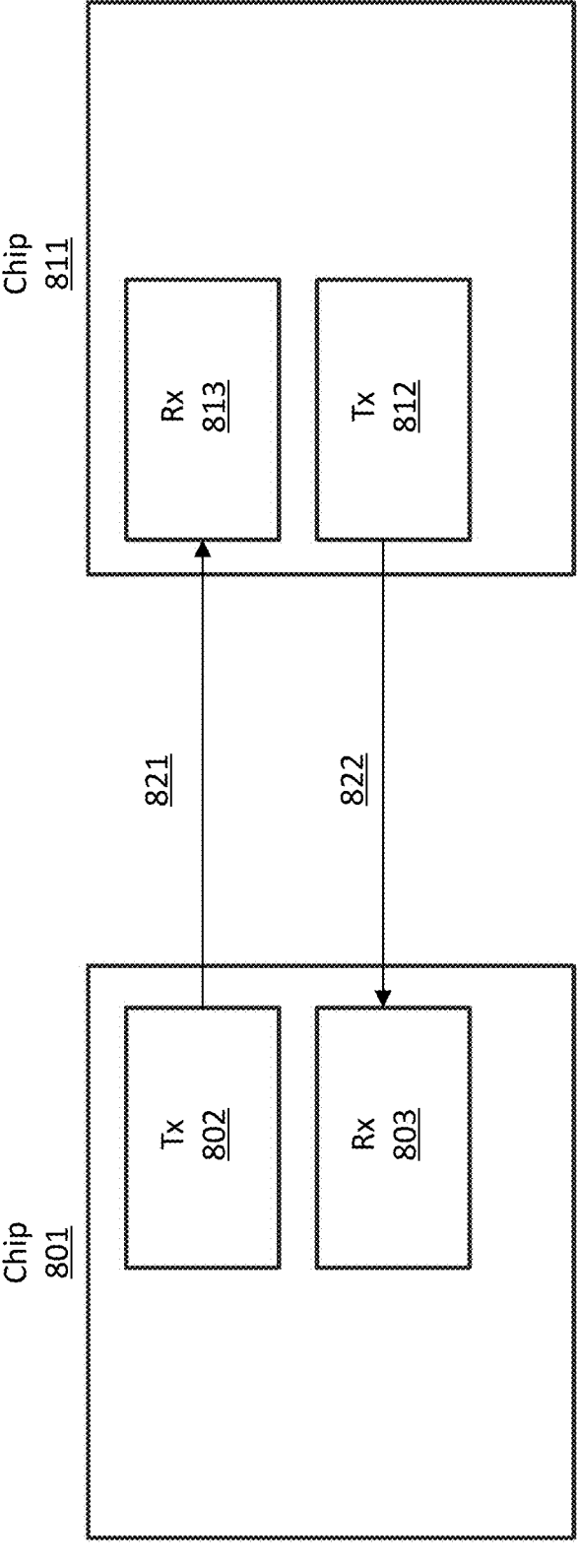
FIG. 8 depicts two chips communicating using the transmitters and receivers of FIG. 1 or FIG. 2.

FIG. 8 depicts system 800. System 800 comprises chips 801 and 811. Chip 801 comprises transmitter 802 and receiver 803, and chip 811 comprises transmitter 812 and receiver 813. Transmitter 802 is coupled to receiver 813 by interface 821, and transmitter 812 is coupled to receiver 803 by interface 822. In one embodiment, transmitters 802 and 812 are instantiations of transmitter 110 in FIG. 1 and receivers 803 and 813 are instantiations of receiver 150 in FIG. 1. In another embodiment, transmitters 802 and 812 are instantiations of transmitter 210 in FIG. 2 and receivers 803 and 813 are instantiations of receiver 250 in FIG. 2.

The embodiments described herein achieve self-tracking, low latency, high bandwidth, and high bandwidth utilization without the need for a multiple-carrier frequency QAM SerDes. Because the mapping and de-mapping circuits operate with a single frequency, they eliminate the need for mixers (for up-conversion and down-conversion), phase extrapolators (to adjust phase error), and low-pass filters (to filter out unwanted frequency components). This circuit achieves simplicity and, therefore, reduces power consumption compared to other circuit techniques used in high-speed SerDes designs, including the PAM-4 used in PCIe 6.0 and 50 Gbps Ethernet.

As process technology advances, the concepts of the embodiments can be further scaled to PAM-32 or PAM architectures with larger numbers of levels to increase the bandwidth or reduce the symbol clock rate for the same bandwidth.

Materials, processes and numerical examples described above are mere examples, and should not be deemed to limit the claims. As used herein, the terms "over" and "on" both inclusively include "directly over" and "directly on" (no intermediate materials, elements or space disposed there between), respectively, and "indirectly over" and "indirectly on" (intermediate materials, elements or space disposed there between), respectively. Likewise, the term "adjacent" includes "directly adjacent" (no intermediate materials, elements or space disposed there between) and "indirectly adjacent" (intermediate materials, elements or space disposed there between).

What is claimed is:

1. A transmitter comprising:
a mapping block to receive a clock signal and a two-bit data signal and to generate a plurality of pairs of digital values;
a plurality of current steering blocks, each of the plurality of current steering blocks receiving one of the plurality of pairs of digital values to generate a pair of currents;
a current summer and modulation block to receive the pair of currents from each of the plurality of current steering blocks to generate a differential output signal;

wherein the differential output signal is a single frequency pulse amplitude modulated signal wherein the single frequency is a frequency of the clock signal.

2. The transmitter of claim 1, wherein the differential output signal transmits a first bit of the two-bit signal when the clock signal is high.

3. The transmitter of claim 2, wherein the differential output signal transmits a second bit of the two-bit signal when the clock signal is low.

4. The transmitter of claim 1, wherein the mapping block further receives a valid signal indicating the two-bit data signal is to be transmitted.

5. A receiver comprising:
a demodulation and amplifier block to receive a differential signal and to generate a plurality of pairs of currents;
a plurality of comparator and calibration blocks, each of the plurality of comparator and calibration blocks receiving one of the plurality of pairs of currents to generate a comparator output; and
a demapping block to receive the comparator output from each of the plurality of comparator and calibration blocks to generate a clock signal and a two-bit data signal.

6. The receiver of claim 5, wherein each of the plurality of comparator and calibration blocks engages in a calibration mode in response to the differential signal.

7. The receiver of claim 6, wherein during the calibration mode, a first input to a digital-to-analog converter in the comparator and calibration block is varied until an output of the digital-to-analog converter matches a first value in the differential signal.

8. The receiver of claim 7, wherein during the calibration mode, a second input to a digital-to-analog converter in the comparator and calibration block is varied until an output of the digital-to-analog converter matches a second value in the differential signal.

9. The receiver of claim 8, wherein during an operation mode, the first input and the second input are applied to the digital-to-analog converter to generate a first current and a second current used to generate the comparator output.

10. The receiver of claim 5, wherein the demapping block further generates a valid signal indicating the two-bit data signal contains valid data.

11. A system comprising:
a transmitter comprising:
a mapping block to receive a clock signal and a two-bit data signal and to generate a plurality of pairs of digital values;
a plurality of current steering blocks, each of the plurality of current steering blocks receiving one of the plurality of pairs of digital values to generate a pair of currents;
a current summer and modulation block to receive the pair of currents from each of the plurality of current steering blocks to generate a differential output signal;
wherein the differential output signal is a single frequency pulse amplitude modulated signal wherein the single frequency is a frequency of the clock signal;
a receiver comprising:
a demodulation and amplifier block to receive a differential signal and to generate a plurality of pairs of currents;
a plurality of comparator and calibration blocks, each of the plurality of comparator and calibration blocks receiving one of the plurality of pairs of currents to generate a comparator output; and a demapping block to receive the comparator output from each of the plurality of comparator and calibration blocks to generate the clock signal and the two-bit data signal; and an interface coupling the transmitter and the receiver.

12. The system of claim 11, wherein the differential output signal transmits a first bit of the two-bit signal when the clock signal is high.

13. The system of claim 12, wherein the differential output signal transmits a second bit of the two-bit signal when the clock signal is low.

14. The system of claim 11, wherein the mapping block further receives a valid signal indicating the two-bit data signal is to be transmitted and the demapping block further generates a valid signal indicating the two-bit data signal contains valid data.

15. The system of claim 11, wherein each of the plurality of comparator and calibration blocks engages in a calibration mode in response to the differential signal.

16. The system of claim 15, wherein during the calibration mode, a first input to a digital-to-analog converter in the comparator and calibration block is varied until an output of the digital-to-analog converter matches a first value in the differential signal.

17. The system of claim 16, wherein during the calibration mode, a second input to a digital-to-analog converter in the comparator and calibration block is varied until an output of the digital-to-analog converter matches a second value in the differential signal.

18. The system of claim 17, wherein during an operation mode, the first input and the second input are applied to the digital-to-analog converter to generate a first current and a second current used to generate the comparator output.

19. The system of claim 11, wherein the transmitter and the receiver maintain a constant DC current over the interface.

20. A method comprising:

generating, by a transmitter, a differential signal in response to a clock signal and a two-bit data signal wherein the differential signal is a single frequency pulse amplitude modulated signal and wherein the single frequency is a frequency of the clock signal;

receiving, by a receiver, the differential signal; and generating, by the receiver, the clock signal and the two-bit data signal in response to the differential signal.

* * * * *